US009697309B1

(12) United States Patent
Fung et al.

(10) Patent No.: US 9,697,309 B1
(45) Date of Patent: Jul. 4, 2017

(54) METASTABILITY-HARDENED SYNCHRONIZATION CIRCUIT

(75) Inventors: Ryan Fung, Mississauga (CA); David Lewis, Toronto (CA); David Neto, Toronto (CA)

(73) Assignee: Altera Corporation, San Jose, CA (US)

( * ) Notice: Subject to any disclaimer, the term of this patent is extended or adjusted under 35 U.S.C. 154(b) by 1063 days.

(21) Appl. No.: 12/563,095

(22) Filed: Sep. 18, 2009

(51) Int. Cl.
*G06F 17/50* (2006.01)

(52) U.S. Cl.
CPC ................................ *G06F 17/5031* (2013.01)

(58) Field of Classification Search
USPC ........ 716/100–101, 104, 108, 113, 115, 134, 716/136, 103; 327/7–9, 39–50, 63, 327/69–71, 105–107, 141–145, 291–294, 327/341; 326/93, 94, 96
See application file for complete search history.

(56) References Cited

U.S. PATENT DOCUMENTS

| | | | | |
|---|---|---|---|---|
| 4,929,850 | A * | 5/1990 | Breuninger | 327/198 |
| 5,250,858 | A * | 10/1993 | Strong | 326/46 |
| 6,265,930 | B1 * | 7/2001 | Walker et al. | 327/407 |
| 6,496,050 | B2 * | 12/2002 | Lloyd | 327/407 |
| 2006/0044022 | A1 * | 3/2006 | Tayler et al. | 327/24 |
| 2009/0153202 | A1 * | 6/2009 | Yagi | 327/141 |

* cited by examiner

*Primary Examiner* — Nghia Doan

(57) ABSTRACT

An integrated circuit (IC) includes a metastability-hardened synchronization circuit. The metastability-hardened synchronization circuit includes a plurality of sampling circuits, and a multiplexer. The sampling circuits sample an input signal to generate a plurality of sampled signals. The multiplexer generates an output signal from the plurality of sampled signals.

22 Claims, 10 Drawing Sheets

METASTABILITY-HARDENED SYNCHRONIZATION CIRCUIT

TECHNICAL FIELD

The disclosed concepts relate generally to electronic circuits and systems. More particularly, the disclosed concepts relate to apparatus and methods for improving system performance by more efficiently deploying system resources and by providing and using metastability-hardened storage circuits in electronic circuits.

BACKGROUND

Advances in microelectronics have enabled the continued increase in transistor densities of integrated circuits (ICs). Advanced ICs can include hundreds of millions of transistors. The relatively large number of transistors enables circuit designers to integrate a relatively large number of functions.

The design of the chips entails competing factor or considerations, such as speed, power dissipation, and cost. Advances in fabrication techniques, such as complementary metal oxide semiconductor (CMOS), have resulted in the scaling of various parameters, such as power supply voltage, threshold voltages, and current-drive capabilities. Designers continually strive to improve device and, hence circuit and system reliability and performance in light of those changes.

SUMMARY

The disclosed concepts relate generally to improving the reliability and operation of electronic circuits, such as ICs. More specifically, the disclosed concepts provide apparatus and methods for providing and using metastability-hardened storage circuits (or synchronizers) in electronic circuits. The disclosed concepts also relate to apparatus and methods for improving the reliability of ICs and efficiently deploying resources, such as metastability-hardened storage circuits. Examples of storage circuits include latches and flip-flops.

In one exemplary embodiment, an IC includes a metastability-hardened synchronization circuit. The metastability-hardened synchronization circuit includes a plurality of sampling circuits, and a multiplexer. The sampling circuits sample an input signal to generate a plurality of sampled signals. The multiplexer generates an output signal from the plurality of sampled signals.

In another exemplary embodiment, an IC includes a first-in, first-out (FIFO) circuit. The FIFO circuit includes a write-side circuit, coupled to a data source. The FIFO circuit also includes a read-side circuit, coupled to the write-side circuit. The read-side circuit includes an empty flag and an at-least-two-elements remaining flag. The read-side circuit waits for the at-least-two-elements remaining flag to assert before transferring data from the write-side circuit to the read-side circuit.

In yet another exemplary embodiment, a system for computer-aided design (CAD) of an IC that implements an electronic design includes a computer. The computer is programmed to identify a set of storage-element chains that are used as synchronizers in the electronic design, and estimate a reliability figure of each chain in the set of storage-element chains. The computer is further programmed to use the respective reliability figures to determine whether each storage element in each chain in the set of storage-element chains should be implemented using a metastability-hardened storage circuit.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to improving the reliability and operation of electronic circuits, such as ICs. More specifically, the disclosed concepts provide apparatus and methods for providing and using metastability-hardened storage circuits (or synchronizers) in electronic circuits. The disclosed concepts also relate to apparatus and methods for improving the reliability of ICs and efficiently deploying resources, such as metastability-hardened storage circuits. Examples of storage circuits include latches and flip-flops.

Storage circuits, such as flip-flops (typically used as synchronizers between two asynchronous clock domains), take a finite amount of time to resolve the logical value of their outputs. The amount of time increases as the interval of time between change in the input to the storage circuit and the sampling instant based on the clock signal shrinks. Under those circumstances, typically a latch inside the flip-flop may become metastable and take a relatively long time to resolve to a stable logic 1 or 0 value at its output.

Figure 1A:
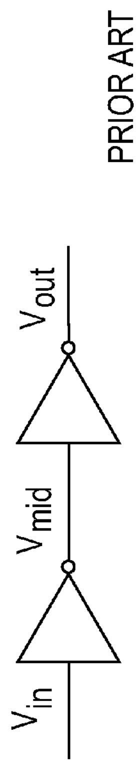
FIGS. 1A-1C illustrate a conventional flip-flop and its related small-signal circuits.
Figure 1B:
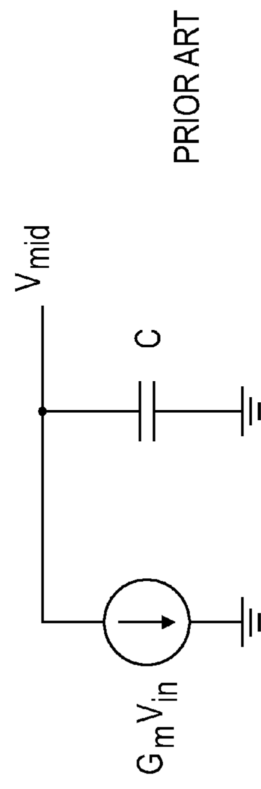
Figure 1C:
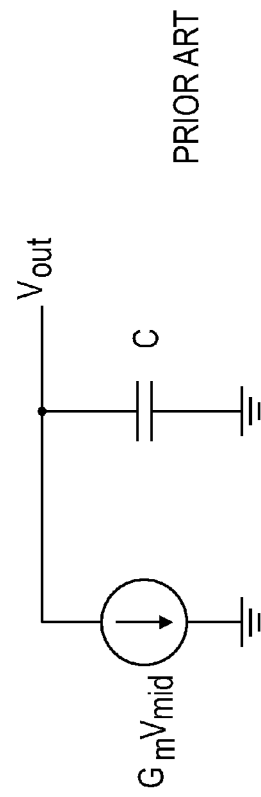

FIGS. 1A-1C illustrate a conventional flip-flop and its related small-signal circuits. The structure, operation, and behavior of the flip-flop in FIGS. 1A-1C falls within the knowledge of persons of ordinary skill in the art.

One may express the failure rate, r, of a flip-flop sampling asynchronous data with switching rate $F_{data}$, and clocked at $F_{clk}$ is given by:

$$r = \frac{c_1 \times F_{data} \times F_{clk}}{e^{t_{met}/c_2}}$$

where $F_{data}$ denotes the frequency of the data transitions, $F_{clk}$ represents the frequency of the sampling clock, and $t_{met}$ is the resolution time available for the sampling flip-flop to resolve to a logic 0 or 1 (i.e., the timing slack available in the flip-flop to flip-flop path).

The constant $c_1$ represents the sampling window of the flip-flop. Constant $c_2$ denotes the time constant of the flip-flop. As persons of ordinary skill in the art understand, the exponential dependence of the failure rate on the timing slack and the constant $c_2$ makes it desirable to provide as small a $c_2$ as possible.

The evolution of modern very large scale integration (VLSI) processes results in a trend towards a worsening of the constant $c_2$. To understand the reason, one may use a small-signal analysis of the behavior of a latch (for example, as used in the flip-flop of FIG. 1A) while in a metastable state.

Referring to FIGS. 1A-1C, consider a latch biased at some small voltage from the metastable point, where the input and output voltages are the same, i.e., Vin=Vout. As the voltage diverges from this metastable point, a simple circuit analysis can show that each inverter in the flip-flop has some small difference in voltage input that causes a current output of Gm*Vin, where Vin represents the difference from the metastable point. In other words, the voltages Vin, Vmid (voltage between the two latches or inverters in the flip-flop), and Vout are defined with respect to the metastable point, so at metastability Vin=Vmid=Vout=0.

Assuming for simplicity that the inverters in the flip-flop of FIG. 1A are identical, a simple circuit analysis shows that their outputs will have a voltage waveform given by:

$$v(t) = e^{\frac{g_m t}{C}},$$

where C includes the load capacitance and the Miller effect applied to any gate-to-drain capacitance of the flip-flop transistors. The time constant $c_2$ is directly related to the exponential divergence of the inverters, such that $c_2 \approx C/g_m$.

Thus a large value of $g_m$ is typically used to achieve a small value of $c_2$. In general, the value of $c_2$ is limited by the intrinsic properties of the transistor. The intrinsic properties of the transistor in turn are limited by the fabrication process.

As persons of ordinary skill in the art understand, $g_m$ depends on the voltages of the metastable point, where:

$$V_{gs} \approx V_{ds} \approx \frac{V_{dd}}{2}.$$

Consequently, one obtains:

$$g_m \approx k \times \left\{\frac{V_{dd}}{2} - V_t\right\},$$

where $V_t$ represents the transistor threshold voltage.

In modern processes, the transistor threshold voltage $V_t$ can approach or, at slow process corners and adverse operational conditions, even exceed the midpoint of the supply voltage, $$\frac{V_{dd}}{2},$$

with the result that $g_m$ approaches zero, and $c_2$ can become relatively large. As a result, the resolution time of the metastable latch increases.

For example in a modern technology operating at a low supply voltage of 0.8V, where at a slow process corner the threshold voltage $V_t$ is 350 mV, the value of $$\left\{\frac{V_{dd}}{2} - V_t\right\}$$

would only be 50 mV. As a comparison, in an older process with, say supply voltages of 1.9V and threshold voltages of 450 mV, one would have value of $$\left\{\frac{V_{dd}}{2} - V_t\right\}$$

of 500 mV (about an order of magnitude larger). Thus, the constant $c_2$ can increase by a relatively large factor in modern processes because of the decreases in the supply voltage $V_{dd}$.

The increase in $c_2$ has ramifications for designs that communicate data between unrelated or unsynchronized clock domains. In such scenarios, synchronizers are used to transfer data between the clock domains and, with degrading values of $c_2$, it can take perhaps 10 or 15 stages of flip-flops (compared to, say, 2 or 3 stages in older technology), to reliably synchronize data.

The larger number of flip-flops increases latency, and costs silicon area. Furthermore, the relatively large silicon areas used in flip-flop chains often prohibits the use of relatively large flip-flop chains to make robust synchronizers at every flip-flop location or even a large number of flip-flop locations in an IC or electronic circuit.

One aspect of the disclosed concepts relates to metastability-hardened storage circuits. Such storage circuits may include latches and flip-flops (e.g., implemented by coupling in cascade a pair of latches).

Figure 2:
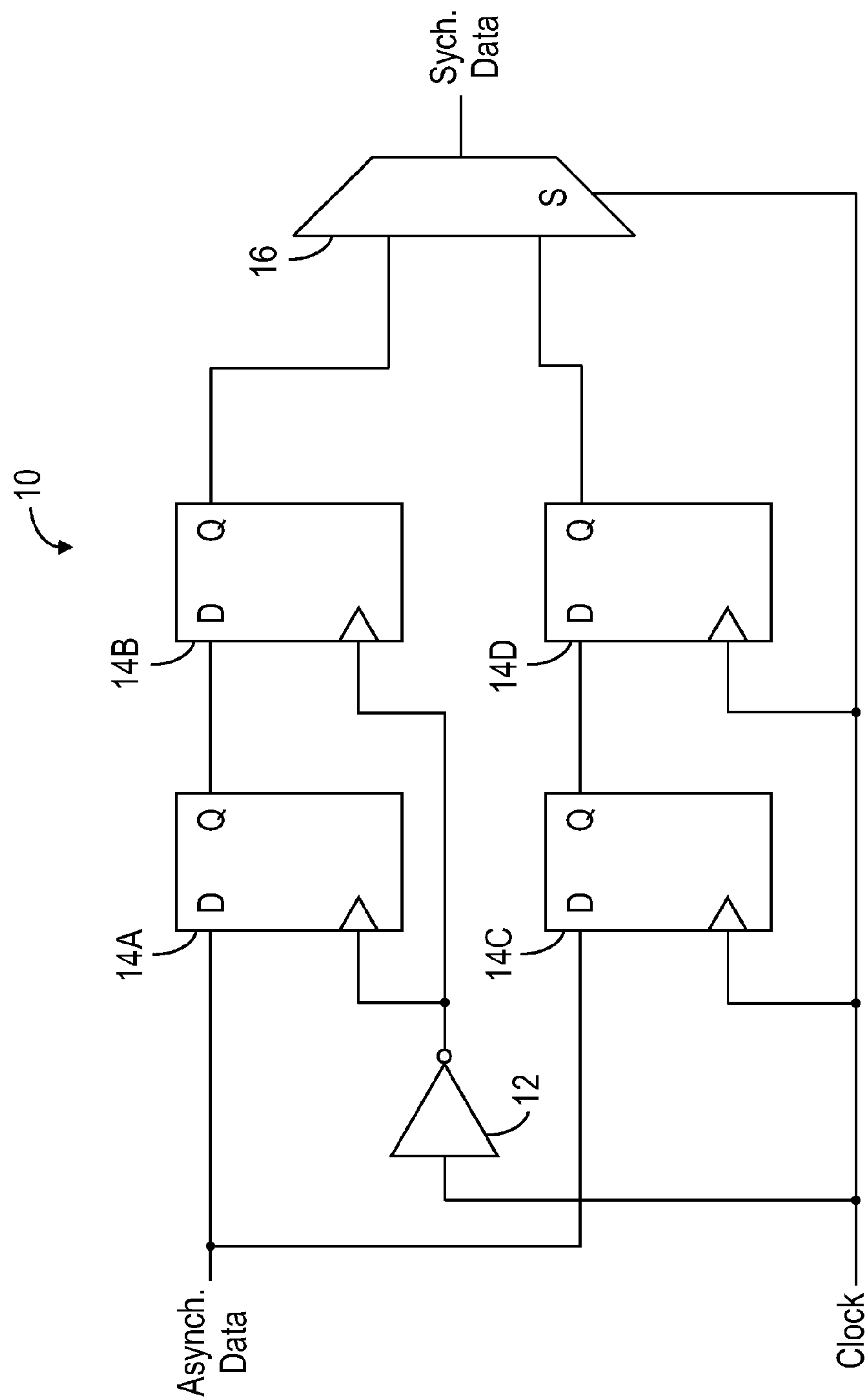
FIG. 2 depicts a metastability-hardened storage circuit 10 according to an exemplary embodiment.

FIG. 2 depicts a metastability-hardened storage circuit 10 according to an exemplary embodiment. Metastability-hardened storage circuit 10 improves synchronization by demultiplexing the asynchronous data stream into multiple streams operating at different phases of a relatively low or lower speed clock signal.

Because $t_{met}$ represents the difference between the clock cycle and the various latch or flip-flop delays and wire, conductor, or interconnect delays, increasing the clock cycle by a given factor increases the value of $t_{met}$ by a larger factor.

For example, suppose that the clock signal has a frequency, $F_{clk}$, of 600 MHz, which corresponds to a clock period of roughly 1,667 picoseconds (ps). Suppose further that the flip-flop delays and routing delay account for 600 ps. Then, $t_{met}$ has a value of 1,667 ps-600 ps, or 1,076 ps.

Now, consider the situation where one halves the clock frequency (to 300 MHz) or, equivalently, increases the clock period to 3.333 nanoseconds (ns). Given those assumptions, $t_{met}$ has a value of 3,333 ps-600 ps, or 2,733 ps. Thus, the value of $t_{met}$ increases by a factor of 2.56, which is still better than using synchronizer chains of twice the length.

Because the lower clock rate is not capable of sampling all data in the 500 MHz stream, the lower speed data are sampled by multiple parallel flip-flop chains, and then multiplexed back into a single stream. Put another way, one splits the input data stream into two or more data streams that are sampled by parallel flip-flop chains. One then multiplexes the plurality of sampled data streams into a single stream.

FIG. 2 shows an exemplary embodiment of such an arrangement. Metastability-hardened storage circuit 10 includes inverter 12, flip-flops 14A-14D, and multiplexer (MUX) 16. Asynchronous data (for example, from another clock domain) drive the data inputs of flip-flops 14A and 14C.

The Q outputs of flip-flops 14A and 14C couple to, and drive, the data inputs of flip-flops 14B and 14D, respectively. Put another way, flip-flops 14A and 14B form one cascade arrangement, while flip-flops 14C and 14D another cascade arrangement.

The Q outputs of flip-flops 14B and 14D drive the inputs of MUX 16. A clock signal drives the select input of MUX 16. Thus, depending on the state of the clock signal (logic zero or one), MUX 16 provides at its output either the Q output of flip-flop 14B or the Q output of flip-flop 14D. The output of MUX 16 represents synchronous data derived from the input asynchronous data.

The clock signal clocks flip-flops 14C and 14D. The complement of the clock signal clocks flip-flops 14A and 14B. Specifically, in response to the clock signal applied to its input, inverter 12 generates at its output the complement of the clock signal, which it provides to flip-flops 14A and 14B.

Although the technique described above and illustrated in FIG. 2 incurs some extra overhead, the total number of flip-flops for a given value of mean time between failures (MTBF) for a circuit or system that includes metastability-hardened storage circuit 10 may be reduced, and latency decreased.

Note that the exemplary embodiment in FIG. 2 shows two clock phases and two parallel data streams. One may, however, extend this concept to any desired number of clock phases and parallel data streams by making appropriate modifications. Those modifications fall within the knowledge and skill of persons of ordinary skill in the art who have the benefit of the description of the disclosed concepts.

As noted, one may use the disclosed metastability-hardened storage circuits in a variety of circuits or devices, and for a range of applications. Examples of such circuits or devices include integrated circuits (ICs), application specific ICs (ASICs), general-purpose or special-purpose ICs, structured ASICs, field programmable gate arrays (FPGAs) programmable logic devices (PLDs), and the like.

Figure 3:
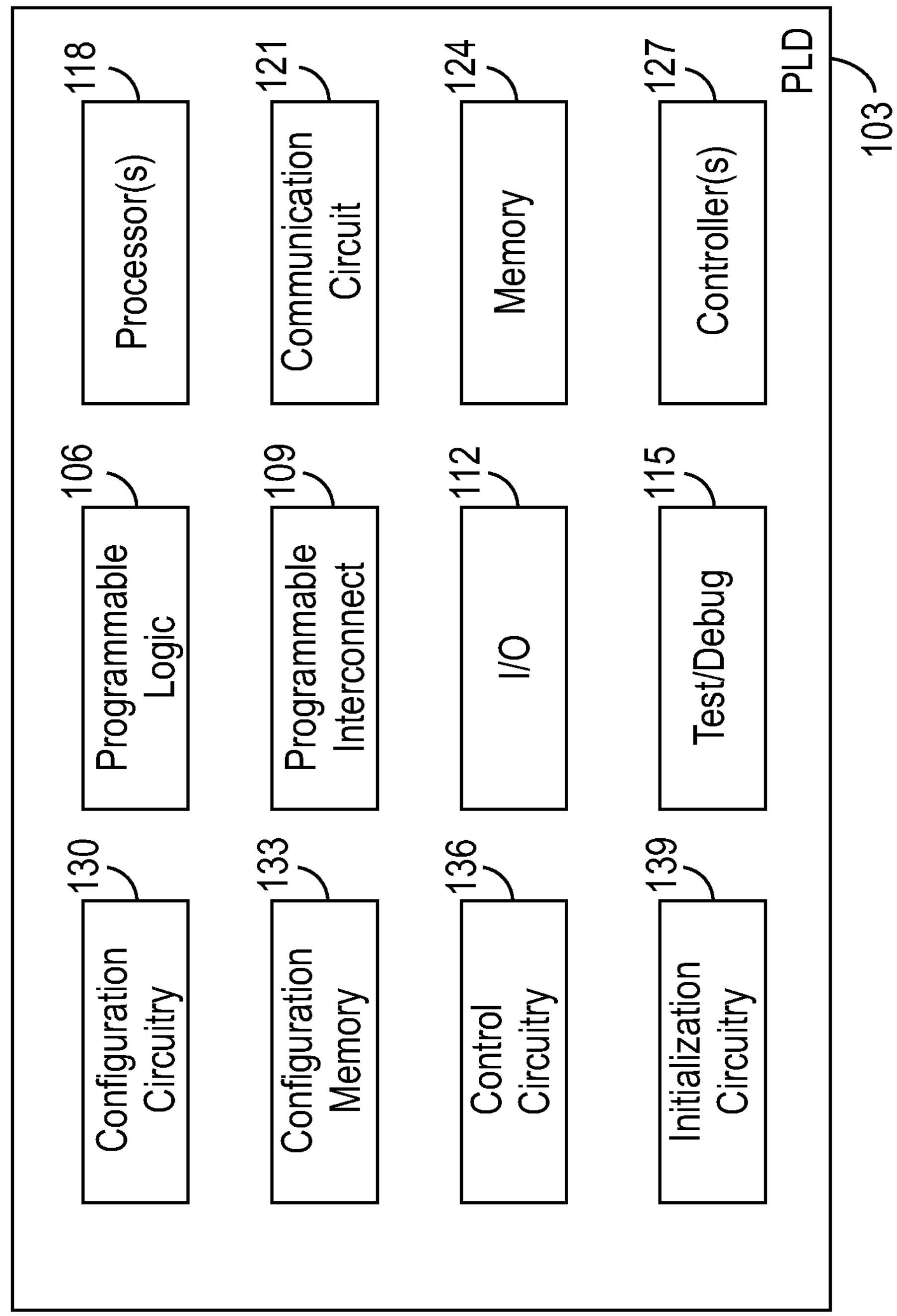
FIG. 3 shows a general block diagram of a PLD that may use metastability-hardened storage circuits according to exemplary embodiments.

FIG. 3 depicts a general block diagram of a PLD 103 that may use metastability-hardened storage circuits according to exemplary embodiments. In addition or instead, PLD 103 (or another type of electronic circuit, as desired, for example, the IC types listed above), may use metastability-hardened storage circuits or synchronizers as described in commonly owned U.S. patent application Ser. No. 12/563,088, Filed on Sep. 18, 2009, and titled "Apparatus for Using Metastability-Hardened Storage Circuits in Logic Devices and Associated Methods," now U.S. Pat. No. 7,977,975. Referring to FIG. 3, PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, and initialization circuit 139, as desired.

Note that the figure shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode or mixed-signal circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103.

Configuration data are typically stored in CRAM 133. The contents of CRAM 133 determine the functionality of various blocks of PLD 103, such as programmable logic 106 and programmable interconnect 109. Initialization circuit 139 may cause the performance of various functions at reset or power-up of PLD 103.

I/O circuitry 112 may constitute a wide variety of I/O devices or circuits, as persons of ordinary skill in the art who have the benefit of the disclosure understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the disclosure. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the disclosure in this document appreciate.

One or more of processor(s) 118 may constitute a digital signal processor (DSP). DSPs allow performing a wide variety of signal processing tasks, such as compression, decompression, audio processing, video processing, filtering, and the like, as desired.

DSPs may include registers, multipliers, accumulators, shift registers, etc. One may use DSPs to implement a wide variety of digital circuitry, such as finite impulse response (FIR) filters, infinite impulse response (IIR) filters.

In some embodiments, the programmable fabric of the PLD includes a number of DSPs. For example, DSP blocks may be grouped into columns across the device.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the disclosure in this document understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired.

Memory devices may include single-port memory, dual-port memory, double data rate (DDR) memory, etc., as desired. Memory devices may be grouped into columns across the device. In some embodiments, memory devices are placed between certain blocks of programmable logic, for example, between certain LABs or other circuitry or blocks.

Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Figure 4:
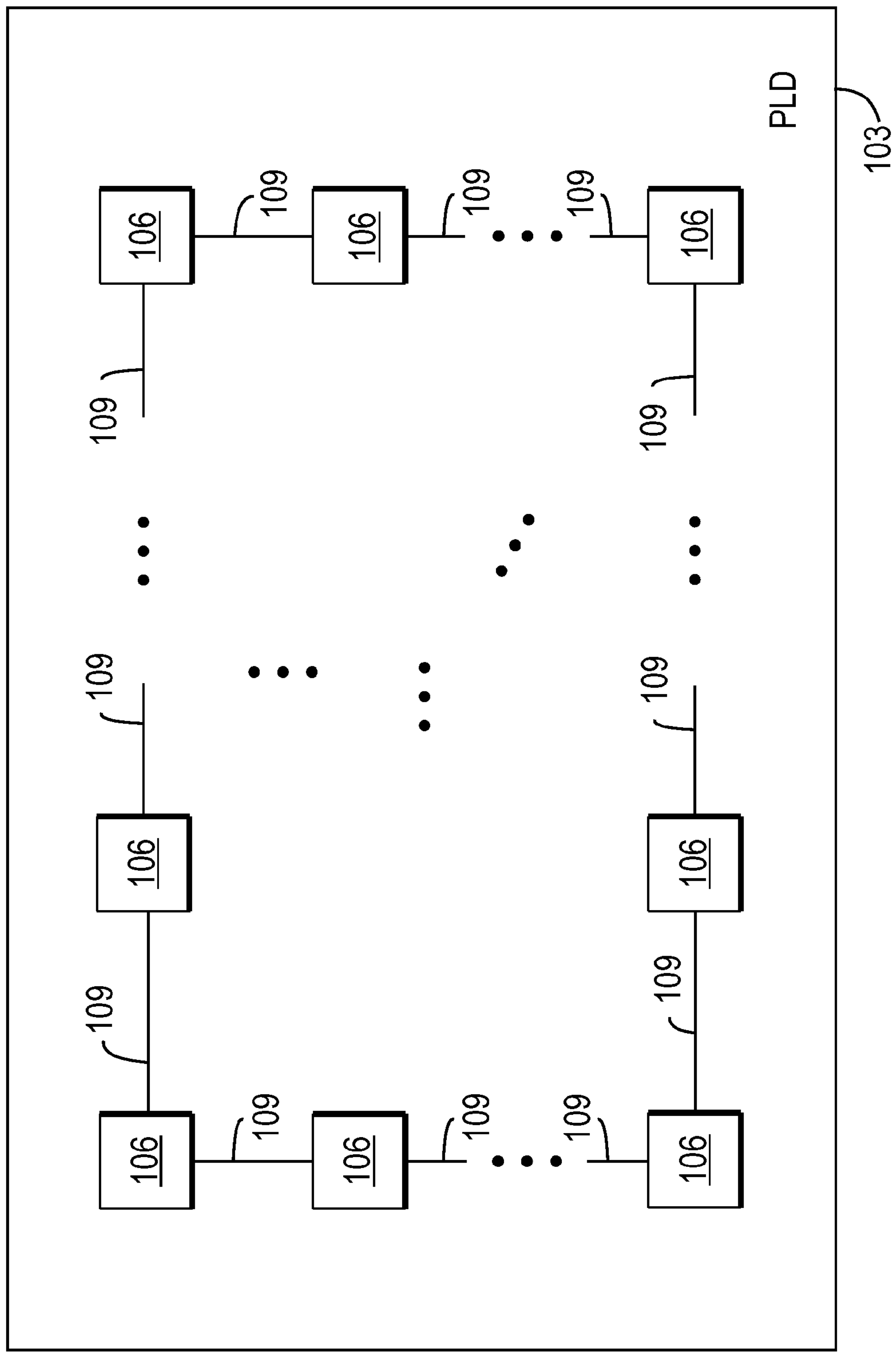
FIG. 4 depicts a floor-plan of a PLD according to an exemplary embodiment.

FIG. 4 shows a floor-plan of PLD 103 according to an exemplary embodiment. A block, part of a block, or a set of blocks may constitute a tile or region of PLD 103.

PLD 103 includes programmable logic 106 arranged as a two-dimensional array. Programmable interconnect 109, arranged as horizontal interconnect and vertical interconnect, couples the blocks of programmable logic 106 to one another. Programmable interconnect 109 may have fixed or variable length and configuration, as desired. One may place the blocks in a particular manner so as to implement a user's design, as persons of ordinary skill in the art who have the benefit of the disclosure in this document understand.

In illustrative embodiments, PLD 103 has a hierarchical architecture. In other words, each block of programmable logic 106 may in turn include smaller or more granular programmable logic blocks or circuits. The types, levels, and granularity of the hierarchical architecture may differ in exemplary embodiments.

For example, in some embodiments, programmable logic 106 may constitute configurable logic named logic array blocks (LABs), and each LAB may include logic elements (LEs), adaptive logic modules (ALMs), or other circuitry, as desired. Each ALM may include at least one LUT and at least one flip-flop, any of which may be metastability-hardened. In addition to LEs and/or ALMs, in some embodiments a LAB may also include a secondary signal region (SS region) for control signal selection and conditioning. More specifically, the secondary signal region may contain circuit or hardware resources that can be shared by multiple ALMs in the LAB.

In other embodiments, the programmable logic may have different names, structures (e.g., hierarchical, circuitry), and/or functionality. For example, in some embodiments, the programmable fabric of the PLD or FPGA may include configurable logic blocks (CLBs). The CLBs may include one or more metastability-hardened storage circuits, as desired. Persons of ordinary skill in the art who have the benefit of this disclosure understand that a wide variety of other arrangements, with varying terminology and topology, are possible, and fall within the scope of the disclosed concepts.

Furthermore, although FIG. 4 shows blocks of programmable logic 106, one may use PLDs with other or additional blocks (e.g., memory, processors, other blocks in FIG. 3, blocks not shown in FIG. 10, etc.) in their floorplans and take advantage of metastability-hardened storage circuits according to the disclosed concepts, as persons of ordinary skill in the art who have the benefit of this disclosure understand. For example, in some embodiments, the PLD may include memory circuitry, such as blocks of memory, as part of the two-dimensional architecture of the PLD.

Regardless of a PLD's architecture, one may employ metastability-hardened storage circuits in any blocks or circuits in the PLD (such as PLD 103), as desired. As merely one example, one may use metastability-hardened storage circuits in the programmable fabric (e.g., programmable logic, programmable interconnect, processors, memory) of a PLD.

Furthermore, generally speaking, one may include and use a desired and appropriate (depending on the application, specifications, technology used, etc.) number of metastability-hardened storage circuits (e.g., latches, flip-flops) in a PLD. Compared to other storage circuits (e.g., conventional latches and flip-flops), metastability-hardened storage circuits typically take up more silicon area, consume more power, or both. Thus, in some embodiments, a subset of the storage circuits in a PLD constitute metastability-hardened storage circuits.

In some embodiments, relatively high-speed interconnect (e.g., programmable interconnect 109) provides paths among at least some of the metastability-hardened storage circuits (e.g., from the output of one such storage circuit to the input of another). The use of those interconnect paths tends to increase the timing slack available.

In some embodiments, some of the blocks of the programmable fabric of the PLD include metastability-hardened storage circuits. In one embodiment, some blocks of programmable logic (e.g., some ALMs) within the PLD include at least one metastability-hardened storage circuit (e.g., latch, flip-flop).

One aspect of the disclosed concepts relates to improving circuit and/or system reliability and MTBF. Such systems often use synchronizers, which typically include storage circuits such as latches and flip-flops.

Synchronizers are commonly used in asynchronous first-in, first-out (FIFO) circuits. One technique for improving the system MTBF beyond the individual synchronizers' MTBFs is for the system to ignore potentially metastable synchronizer outputs during steady-state operation of streaming applications.

Figure 5:
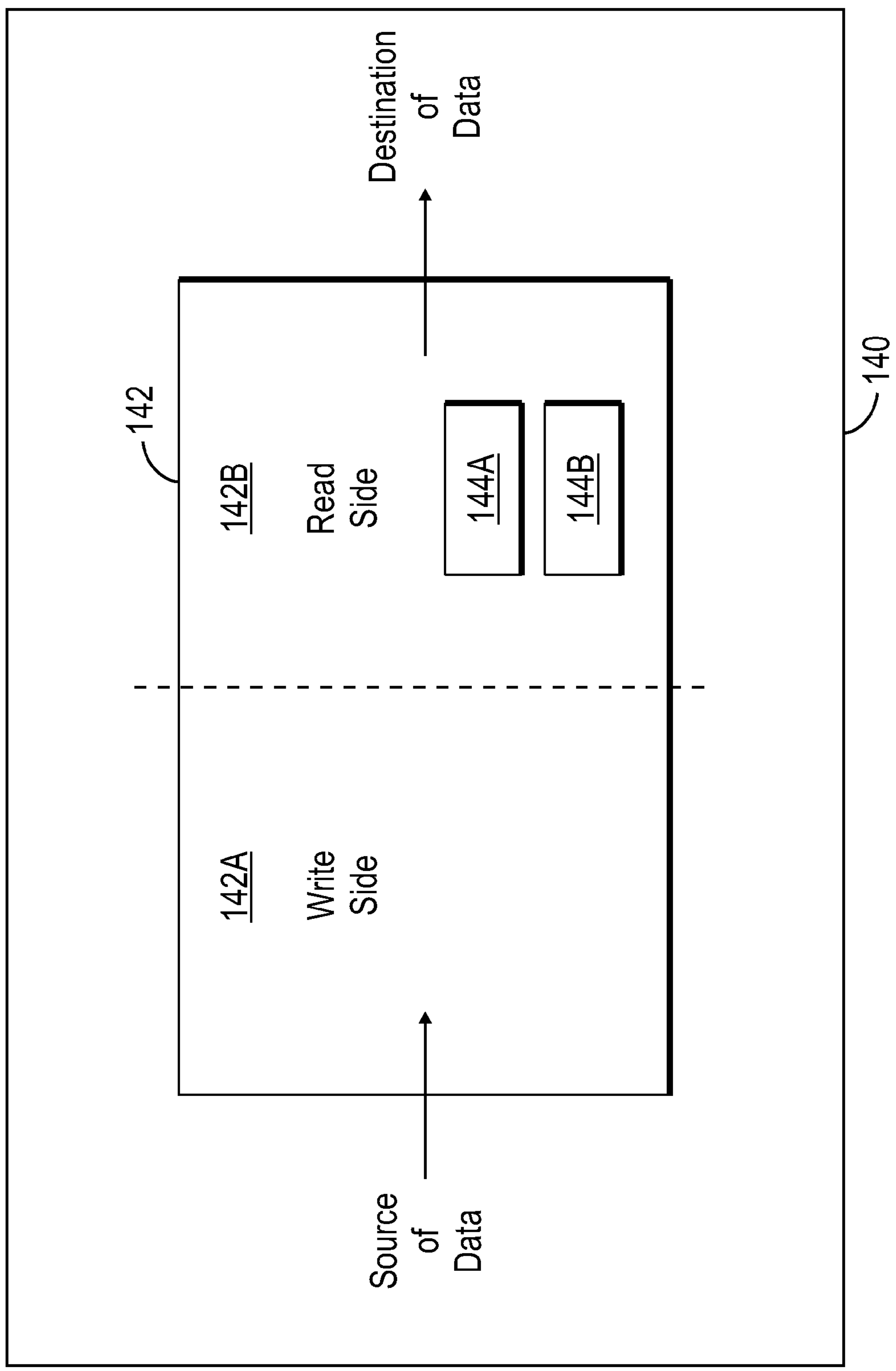
FIG. 5 illustrates an IC (or system or circuit) according to an exemplary embodiment.

In some embodiments, the FIFO read side (which operates in one clock domain) has both an empty flag and an at-least-two-elements-remaining flag. FIG. 5 depicts an IC or system or circuit 140 according to an exemplary embodiment. IC 140 includes FIFO 142.

FIFO 142 includes write-side circuitry 142A and read-side circuitry 142B. Write-side circuitry 142A couples to a source of data, for example, streaming data, such as a circuit or block within or external to IC 140. Read-side circuitry 142B couples to a destination for the data, e.g., a circuit or block within or external to IC 140.

Read-side circuitry 142B includes empty flag 144A and at-least-two-elements-remaining flag 144B. One may implement flags 144A and 144B in a variety of ways, for example, by using a comparator and a register or flip-flop, or by waiting after empty flag 144A is de-asserted (fixed latency), as persons of ordinary skill in the art who have the benefit of the description of the disclosed concepts understand.

When beginning to stream data from the write domain (which typically operates in another clock domain) to the read domain, read-side circuitry 142B should wait for at-least-two-elements-remaining flag 144B to assert. Put another way, read-side circuitry 142B waits an extra clock cycle before reading out available data. Doing so reduces the probability that FIFO 142 empties and, hence, the probability of failure of the synchronizers managing the data transfer.

Once flag 144B asserts, read-side circuitry 142B should start reading data, and switch to monitoring empty flag 144A to look for a stall in the data stream. An assertion of empty flag 144A indicates that FIFO 142 is empty, and a stall in the data stream has occurred.

During streaming, the buffer of data in FIFO 142 might oscillate between one and two elements as the write and read clocks jitter. In both of those cases, however, empty flag 144A is stable (assuming the respective empty-flag logic is glitch-free).

The advantage of this technique is that the system is immune to metastability events in FIFO 142, while the data are streaming. Contrast the above technique with the read side reading data when it immediately becomes available. In this case, the FIFO may become empty every few cycles, and a metastability event has a higher corresponding probability of upsetting the system.

By reducing the probability that metastability events propagate out of the FIFO, smaller synchronization chain depths may be tolerable, thus reducing the demand for metastability hardened flip-flops. Also, if the architecture of the system or IC contains several chains of metastability-hardened registers that are of pre-built length, reducing the chain depth needed in FIFOs can make more of these pre-built chains usable.

Another aspect of the disclosed concepts relates to apparatus and methods for identifying flip-flops that are used as synchronizers, and locating them in metastability-hardened flip-flops. In other words, the disclosed apparatus and methods identify flip-flops that are used as synchronizers in a design, circuit, or system, and implement them using metastability-hardened flip-flops.

Figure 6:
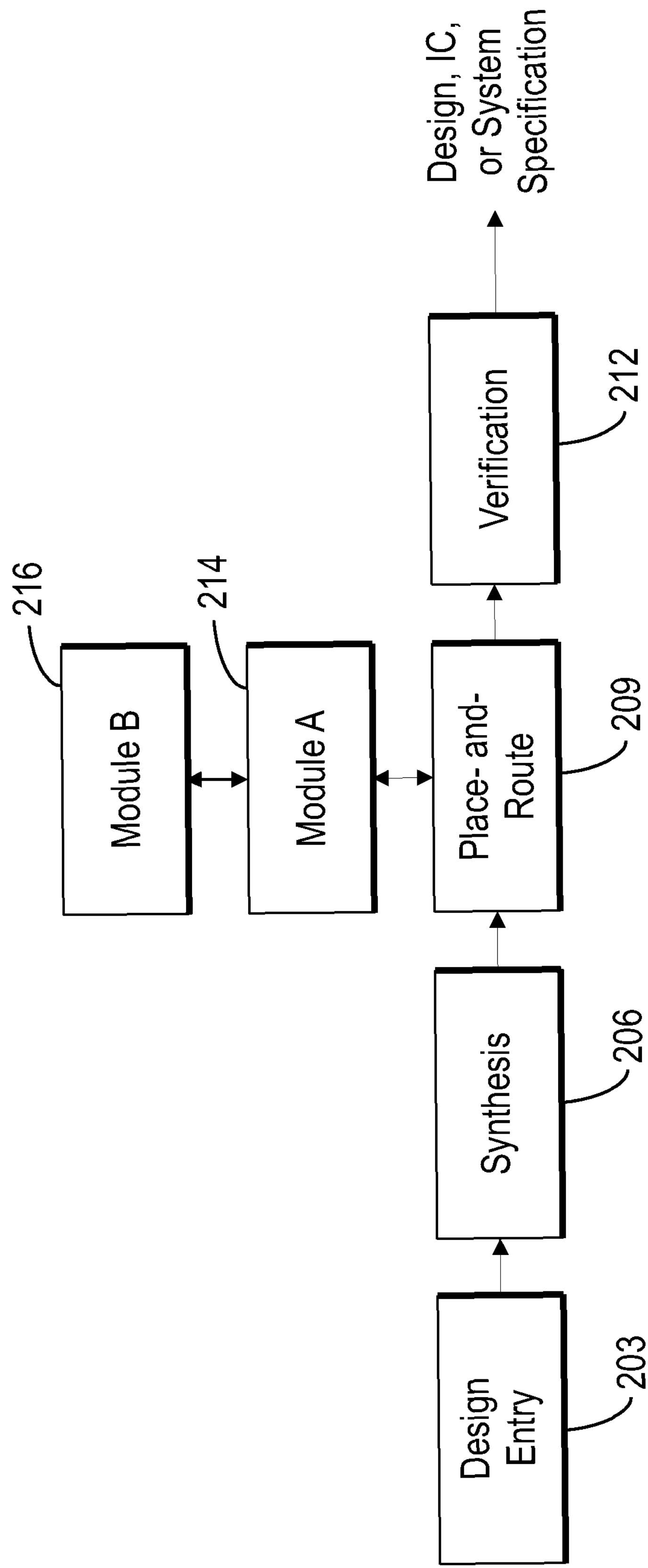
FIG. 6 shows various software modules that PLD computer-aided design (CAD) software according to illustrative embodiments uses.

Chains of flip-flops that will be used as synchronizers in a design can be identified during a computer-aided design (CAD) flow. The CAD flow includes software that runs on a computer. FIG. 6 shows various software modules that IC CAD software according to illustrative embodiments uses.

The CAD flow includes several software modules. In the embodiment shown, the modules include design-entry module 203, synthesis module 206, place-and-route module 209, tile-selection module 210, and verification module 212. The following description provides an explanation of the operation of each module.

In addition to the techniques described here, the CAD flow of FIG. 6 may have a variety of applications, as persons of ordinary skill in the art who have the benefit of this disclosure understand. Examples include design area, timing performance, power requirements, and routability, as desired.

Design-entry module 203 allows the editing of various design description files using graphical or textual descriptions of a circuit or its behavior, such as schematics, hardware description languages (HDL), or waveforms, as desired. The user may generate the design files by using design-entry module 203 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 206 accepts the output of design-entry module 203. Based on the user-provided design, synthesis module 206 generates appropriate logic circuitry that realizes the user-provided design. One or more ICs (not shown explicitly), such as PLD 103 in FIG. 3, implement the synthesized overall design or system.

Synthesis module 206 may also generate any glue logic that allows integration and proper operation and interfacing of various modules in the user's designs. For example, synthesis module 206 provides appropriate hardware so that an output of one block properly interfaces with an input of another block. Synthesis module 206 may provide appropriate hardware so as to meet the specifications of each of the modules in the overall design or system.

Furthermore, synthesis module 206 may include algorithms and routines for optimizing the synthesized design. Through optimization, synthesis module 206 seeks to more efficiently use the resources of the one or more ICs (e.g., PLDs) that implement the overall design or system. Synthesis module 206 provides its output to place-and-route module 209. Following synthesis, one may include a technology mapping module (not shown explicitly).

Place-and-route module 209 uses the designer's timing specifications to perform optimal logic mapping and placement. The logic mapping and placement determine the use of logic resources within the ICs (e.g., PLD(s)). By the use of particular programmable interconnects with the ICs (e.g., PLD(s)) for certain parts of the design, place-and-route module 209 helps optimize the performance of the overall design or system. By the proper use of the routing resources in the IC, place-and-route module 209 helps to meet the critical timing paths of the overall design or system.

Place-and-route module 209 optimizes the critical timing paths to help provide timing closure faster in a manner known to persons of ordinary skill in the art with the benefit of this disclosure. As a result, the overall design or system can achieve faster performance (i.e., operate at a higher clock rate or have higher throughput).

Verification module 212 performs simulation and verification of the design. The simulation and verification seek in part to verify that the design complies with the user's prescribed specifications. The simulation and verification also aim at detecting and correcting any design problems before prototyping the design. Thus, verification module 212 helps the user to reduce the overall cost and time-to-market of the overall design or system.

Verification module 212 may support and perform a variety of verification and simulation options, as desired. The options may include functional verification, test-bench generation, static timing analysis, timing simulation, hardware/software simulation, in-system verification, board-level timing analysis, signal integrity analysis and electromagnetic compatibility (EMC), formal netlist verification, and the like, as persons of ordinary skill in the art who have the benefit of the description of this disclosure understand.

Note that one may perform other or additional verification techniques as desired and as persons of ordinary skill in the art who have the benefit of this disclosure understand. Verification of the design may also be performed at other phases in the flow, as appropriate, and as desired.

The CAD flow of FIG. 6 includes two additional modules, shown as module A (labeled as 214), and module B (labeled as 216). Module 214 (module A) interacts with place-and-route module 209. Through this interaction, module 214 modifies the behavior and/or functionality of place-androute module 209 according to metastability-hardened flip-flop specifications or requirements (for example, as described below with respect to synchronizer chains). Module 216 (module B), which communicates with module 214, determines which flip-flops should be implemented using metastability-hardened flip-flops (for example, as described below with respect to synchronizer chains). The techniques and methods described below use module 214 and module 216 in order to identify flip-flops or registers whose implementation with metastability-hardened flip-flops or registers improves the overall MTBF to given or desired levels or values.

Figure 7:
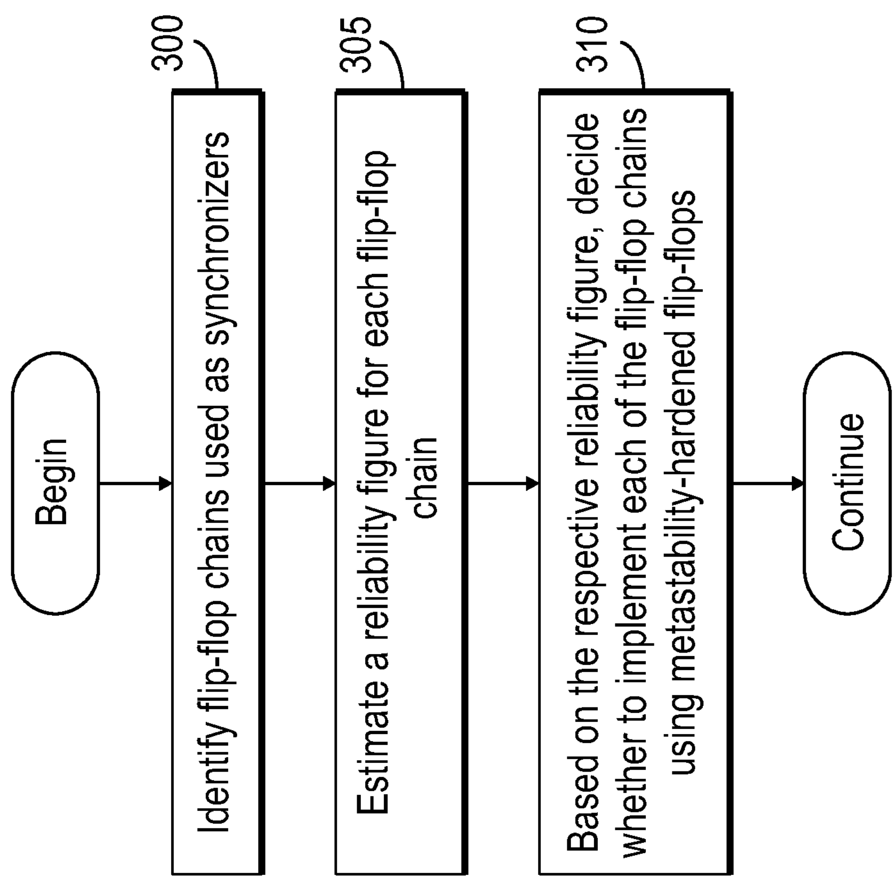
FIG. 7 depicts a simplified flow diagram for a method of processing flip-flops used as synchronizers as part of a CAD flow according to exemplary embodiments.

As noted, the disclosed concepts may use a CAD flow, such as the CAD flow shown in FIG. 6. In some embodiments, one may use the CAD flow shown in FIG. 6 to identify flip-flops or flip-flop chains that are used as synchronizers, and implement them using metastability-hardened flip-flops. FIG. 7 shows a simplified flow diagram for a method of processing flip-flops used as synchronizers as part of a computer-aided design (CAD) flow.

At 300, flip-flop chains used as synchronizers are identified. At 305, an estimate of a reliability figure is made for each flip-flop chain. At 310, a decision is made, based on the respective reliability figure for each flip-flop chain, whether to implement that flip-flop chain using metastability-hardened flip-flops. The following description provides details of each operation.

The identification of sets or chains of flip-flops used as synchronizers begins by looking for paths in the circuit or design that are not analyzed against a synchronous timing relationship (i.e., paths that are analyzed without reference to a synchronous timing relationship). The destination of those paths will be the head of the flip-flop chains (i.e., flip-flop chains used as synchronizers). The remainder of the flip-flop sets or chains can be identified by looking at the series of synchronous registers or flip-flops fed by the heads of the flip-flop chains. For further details, see commonly owned U.S. patent application Ser. No. 12/384,377, filed on Apr. 3, 2009, and titled "Method and Apparatus for Protecting, Optimizing, and Reporting Synchronizers."

Once the chains of flip-flops used as synchronizers are identified, an MTBF estimate can be computed for each chain (i.e., an MTBF estimate is computed for the case where the synchronizer chains do not use metastability-hardened flip-flops). The MTBF estimate is typically a function of the rate of the data being synchronized, the speed of the clock feeding the flip-flop chain, estimates of slack for the flip-flop chain hops, and assumed metastability constants (which are a function of the registers used).

The data rate and clock rates should be known by the start of the placement and routing portion of the CAD flow if the design is properly timing constrained. The slacks of the chain hops can be estimated by assuming a data delay equal to the estimated flip-flop-to-flip-flop delay that will be achieved in the IC being designed or used, given a good placement and routing of the flip-flops. In some embodiments, this figure can be assumed to be the minimum flip-flop-to-flip-flop delay.

Assuming the metastability constants of the non-metastability-hardened flip-flops, the MTBF of each chain can be estimated. If the MTBF of a flip-flop chain is sufficiently large for good system reliability (as an example, say, more than a million years, or other desired or appropriate value), that flip-flop chain can target any flip-flop in the device (i.e., it may be implemented using any flip-flop available in the IC). Thus, if the MTBF estimate is equal to or above a given or desired threshold, one may use any flip-flop in the device (metastability-hardened or not).

On the other hand, if the MTBF estimate is not sufficiently large, the respective flip-flop chain targets metastability-hardened flip-flops to try to achieve reasonable reliability. Put another way, a flip-flop chain whose MTBF estimate falls below a given or desired threshold is implemented using metastability-hardened flip-flops. In some embodiments, rather than using metastability-hardened flip-flops to implement all registers or flip-flops in a chain, the number of metastability-hardened flip-flops demanded can be limited by looking for the minimum number that are needed for reasonable values of MTBF (i.e., resulting in MTBF values that meet or exceed a desired or given threshold). This technique can be advantageous in architectures where there are relatively few metastability-hardened flip-flops.

Minimizing the number of metastability-hardened flip-flops used per flip-flop chain decreases the chance of exhausting the supply of metastability-hardened flip-flops.

In some architectures, the metastability-hardened flip-flops may be more sparsely located. Consequently, it may be advantageous to consider that attribute when estimating the delay between the metastability-hardened flip-flops.

By way of illustration, consider an exemplary embodiment of a PLD. If there are two metastability-hardened flip-flops or registers per LAB, but they exist in every LAB, the delay estimates used for consecutive chain flip-flops should alternate between an intra-LAB flip-flop-to-flip-flop delay and an adjacent-LAB flip-flop-to-flip-flop delay.

As another example, consider a PLD that includes two metastability-hardened flip-flops or registers per LAB, and they exist in every other LAB, vertically and horizontally (¼ of the LABs). In this scenario, consecutive chain elements should assume an intra-LAB flip-flop-to-flip-flop delay and a two-unit (i.e. two timing units) inter-LAB flip-flop-to-flip-flop delay.

Note that when choosing which registers or flip-flops of a chain should use metastability-hardened flip-flops or registers (or which chains should be implemented using metastability-hardened flip-flops or registers), preference should be given to those with large output slack (if it varies) in order to give the "better" flip-flops more slack time. Slack variation commonly occurs because of logic between the chain registers; it is not uncommon to use flip-flops for both synchronization and favorable logic re-timing under latency constraints.

Referring to the CAD flow, at the conclusion of placement, the flip-flops of the respective flip-flop chains used as synchronizers should end up in metastability-hardened locations (i.e., be implemented using metastability-hardened flip-flops). Generally, one may achieve that goal by discouraging placement of flip-flops that should be implemented using metastability-hardened flip-flops in non-metastability-hardened locations (i.e., at locations that do not include metastability-hardened flip-flops).

More specifically, one may consider or treat or classify such placement solutions as illegal, or penalize (for example, with a cost) the placement of problematic synchronizer chains at non-metastability-hardened flip-flop locations (i.e., not implementing them with metastability-hardened flip-flops). One may increase the penalty as the placement proceeds if unfavorable placements persist.

Figure 8:
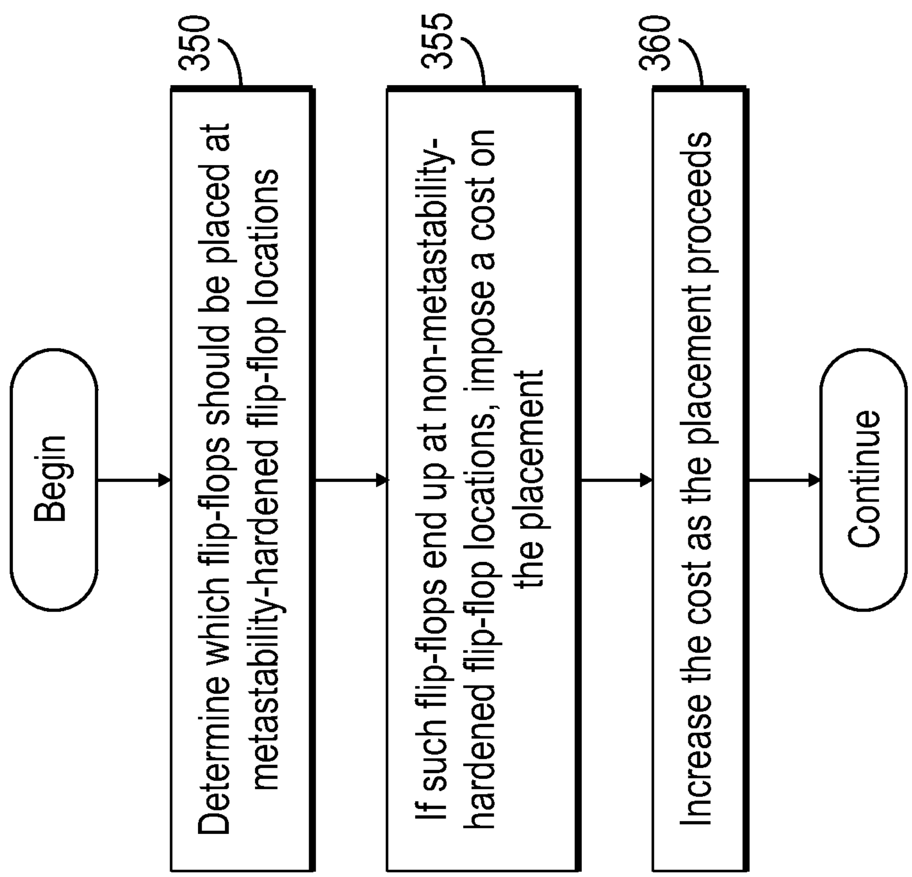
FIG. 8 illustrates a simplified flow diagram for a method of placing flip-flops as part of a CAD flow according to an exemplary embodiment.

FIG. 8 illustrates a simplified flow diagram for a method of placing flip-flops as part of a CAD flow according to an exemplary embodiment. Specifically, the flow diagram shows a method of implementing a cost function.

At 350, a determination is made as to which flip-flops should be placed at metastability-hardened locations (i.e., implemented using the metastability-hardened flip-flop resources of the IC). At 355, if such flip-flops end up at non-metastability-hardened flip-flop locations, a cost is imposed on the respective placement. At 360, the cost is increased as the placement proceeds.

Some placement algorithms use clustering techniques to reduce their problem sizes. For example, with CAD flows that target PLDs, clustering at the LAB-level is a common technique to both reduce the placement problem size and to abstract away from the placement problem the complexity related to determining legal LAB configurations.

Figure 9:
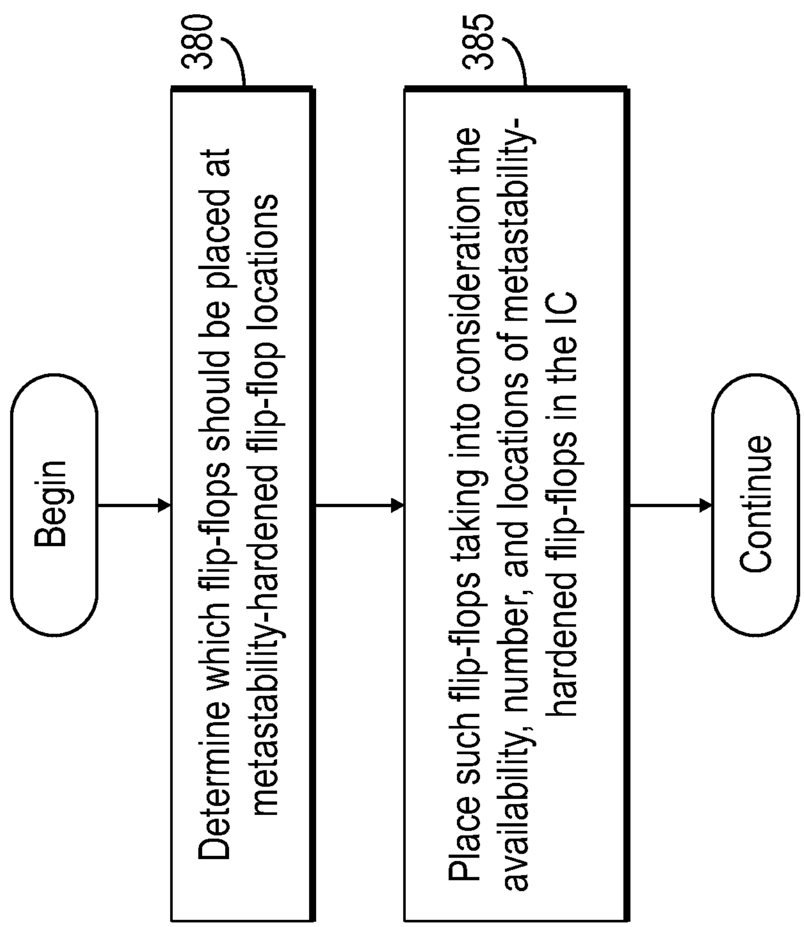
FIG. 9 depicts a simplified flow diagram for a method of placing flip-flops as part of a CAD flow according to another exemplary embodiment.

When clustering synchronization chain flip-flops that should target metastability-hardened flip-flop locations, the clustering algorithm or module (not shown explicitly in FIG. 6) should consider the supply of metastability-hardened flip-flops in the possible target locations for the cluster. FIG. 9 depicts a simplified flow diagram for a method of placing flip-flops as part of a CAD flow according to another exemplary embodiment.

At 380, a determination is made as to which flip-flops should be placed at metastability-hardened locations (i.e., implemented using the metastability-hardened flip-flop resources of the IC). At 385, such flip-flops are placed, taking into consideration the availability, number, and locations of metastability-hardened flip-flops in the IC (e.g., PLD).

As an example, suppose that a subset of the LABs have 10 metastability-hardened flip-flops or registers and a subset of the LABs have no metastability-hardened flip-flops or registers. If the CAD flow is clustering to the LAB level, it will have to limit the number of metastability-hardened flip-flops or registers in a cluster to 10 or fewer.

The LAB clusters that are created with metastability-hardened flip-flops or registers can then be legally placed at any of the LAB locations that contain metastability-hardened flip-flops or registers. In some embodiments, the CAD flow maximizes the number of flip-flops that should be implemented using metastability-hardened flip-flops in a placement cluster (without significantly harming design optimization flexibility) if that cluster has at least one such flip-flop.

In some embodiments, a PLD architecture has relatively few LABs with metastability-hardened flip-flops or registers that are scattered sparsely throughout the device. In this scenario, the clustering algorithm may also favor aggregating as many metastability-hardened flip-flops or registers as possible in a given cluster (without significantly harming design optimization flexibility), once it has acquired at least one hardened metastability-hardened flip-flop or register. In some embodiments, the CAD flow may consider delay between or among sparsely located metastability-hardened flip-flops when estimating reliability, such as by calculating MTBF values or figures.

In general, synchronizer chains tend to occur in groups. For example, consider the task of synchronizing all the bits of a gray code counter in a FIFO from one clock to another. By traversing the logic design netlist or searching the design hierarchy for nearby flip-flop or register chains, related metastability-hardened flip-flops or registers can be grouped as much as possible to avoid exceeding the supply of locations in the IC (e.g., PLD) that support clusters of metastability-hardened flip-flops or registers. By finding related flip-flops or registers for grouping, any adverse impacts to design optimization potential can be limited.

Some routing algorithms may duplicate flip-flops/registers, swap flip-flops/registers to reach favorable routing drivers, or both. Registers or flip-flops in a synchronizer chain should not be duplicated. Thus, duplication of the respective registers should be avoided by place-and-route module 209 (see FIG. 6), regardless of whether the placement and routing is with regard to metastability-hardened flip-flops. Synchronization relies on making a unique decision about a signal being synchronized and duplicating a storage circuit in a synchronization chain, and effectively shortens a chain, because non-unique decisions may be made after the duplication point.

Furthermore, the swapping or movement of flip-flops/registers by place-and-route module 209 should be restricted to locations with the appropriate number, and potentially the arrangement, of metastability-hardened flip-flops. In exemplary embodiments, place-and-route module 209 optimizes flip-flop arrangement within the resources available in an IC, for example, by swapping LEs or ALMs within a LAB in a PLD to attempt to reach favorable routing drivers.

By way of illustration, consider a PLD according to an exemplary embodiment in which half the ALMs in a LAB have two metastability-hardened flip-flops (ALM type A), and half have four metastability-hardened flip-flops (ALM type B).

As an example, if place-and-route module 209 seeks to route signals for an ALM containing three metastability-hardened flip-flops, it should be restricted to considering the ALM locations that have four metastability-hardened flip-flops. Given that place-and-route modules generally operate on graphs (of the circuit or design), this restriction usually involves temporarily removing or pruning the respective edges (options) from the graph.

Note that if the number of metastability-hardened flip-flops in the ALM being routed can be reduced to two, and they are arranged in the half of the ALM that is common between ALM type A and ALM type B, then place-and-route module 209 can consider all ALM locations in the LAB in performing a swap. This additional flexibility might be considered when choosing which flip-flops of a chain should be metastability-hardened, and when clustering/placing the metastability-hardened flip-flops (or registers) into ALM locations.

Figure 10:
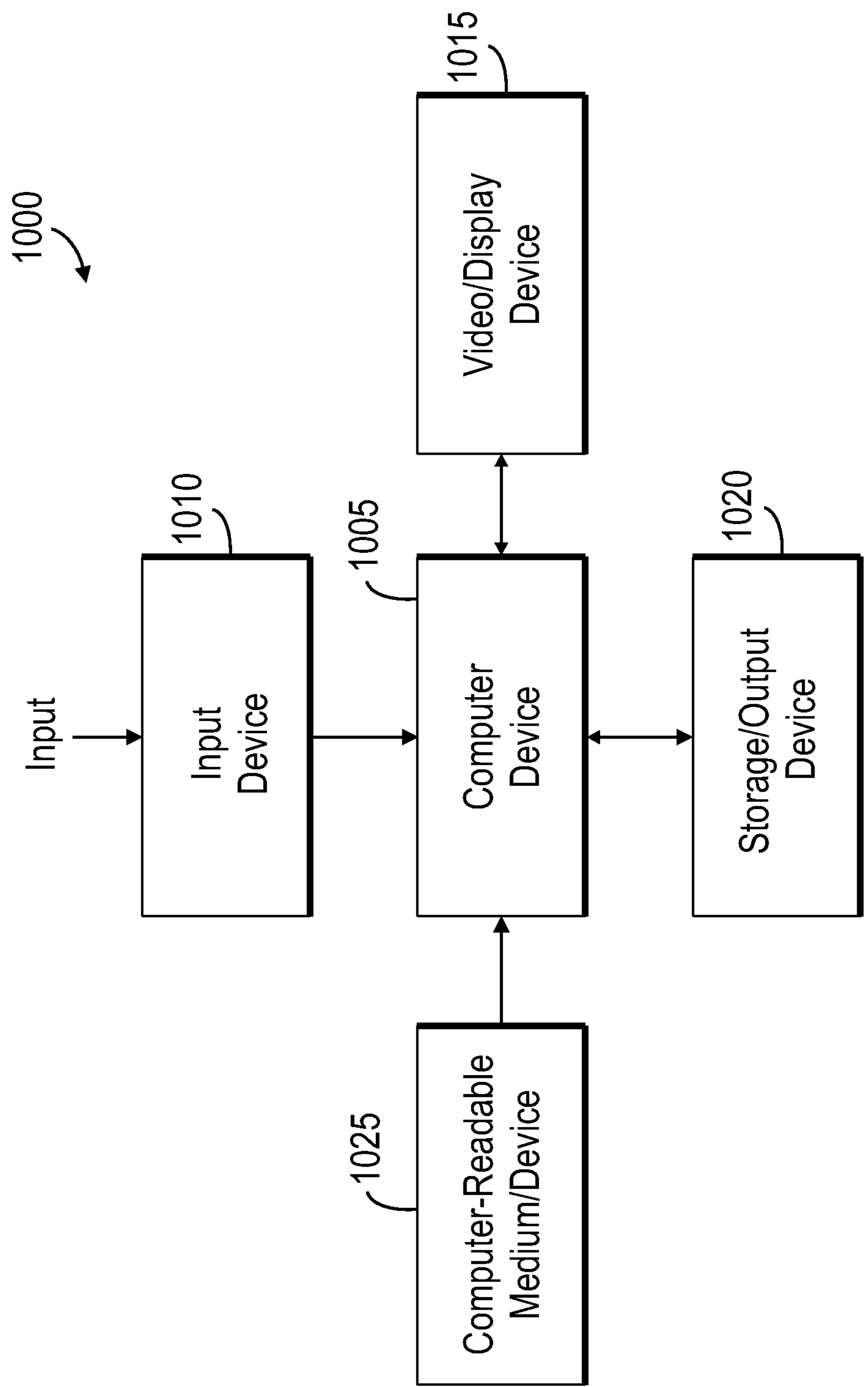
FIG. 10 shows a block diagram of an exemplary computer system for processing information according to the disclosed concepts.

One may run or execute the disclosed algorithms, methods, or software on computer systems or processors. FIG. 10 shows a block diagram of an exemplary computer system 1000 for processing information according to the disclosed concepts. Persons of ordinary skill in the art who have the benefit of the disclosure understand that one may use a wide variety of other computer systems, processors, microcomputers, workstations, and the like, as desired.

System 1000 includes a computer device 1005, an input device 1010, a video/display device 1015, and a storage/output device 1020, although one may include more than one of each of those devices, as desired.

Computer device 1005 couples to input device 1010, video/display device 1015, and storage/output device 1020. System 1000 may include more that one computer device 1005, for example, a set of associated computer devices or systems, as desired, and as persons of ordinary skill in the art who have the benefit of the description of the disclosed concepts understand.

System 1000 operates in association with input from a user. The user input typically causes system 1000 to perform specific desired information-processing tasks, including circuit synthesis and simulation. System 1000 in part uses computer device 1005 to perform those tasks. Computer device 1005 includes an information-processing circuitry, such as a central-processing unit (CPU), although one may use more than one CPU or information-processing circuitry, as persons skilled in the art would understand.

Input device 1010 receives input from the user and makes that input available to computer device 1005 for processing. The user input may include data, instructions, or both, as desired. Input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to computer device 1005. Similarly, the user operates the pointing device to provide cursor position or control information to computer device 1005.

Video/display device 1015 displays visual images to the user. The visual images may include information about the operation of computer device 1005, such as graphs, pictures, images, and text. The video/display device may constitute a computer monitor or display, a projection device, and the like, as persons of ordinary skill in the art would understand. If a system uses a touch-sensitive display, the display may also operate to provide user input to computer device 1005.

Storage/output device 1020 allows computer device 1005 to store information for additional processing or later retrieval (e.g., softcopy), to present information in various forms (e.g., hardcopy), or both. As an example, storage/output device 1020 may constitute a magnetic, optical, or magneto-optical drive capable of storing information on a desired medium and in a desired format. As another example, storage/output device 1020 may constitute a printer, plotter, or other output device to generate printed or plotted expressions of the information from the computer device 1005.

Computer-readable medium 1025 interrelates structurally and functionally to computer device 1005. Computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by computer-readable medium 1025, the functional descriptive material imparts functionality. The functional descriptive material interrelates to computer-readable medium 1025.

Information structures within the functional descriptive material define structural and functional interrelations between the information structures and computer-readable medium 1025 and/or other aspects of system 1000. These interrelations permit the realization of the information structures' functionality. Moreover, within such functional descriptive material, computer programs define structural and functional interrelations between the computer programs and computer-readable medium 1025 and other aspects of system 1000. These interrelations permit the realization of the computer programs' functionality.

By way of illustration, computer device 1005 reads, accesses, or copies functional descriptive material into a computer memory (not shown explicitly in the figure) of computer device 1005. Computer device 1005 performs operations in response to the material present in the computer memory. Computer device 1005 may perform the operations of processing a computer application that causes computer device 1005 to perform additional operations. Accordingly, the functional descriptive material exhibits a functional interrelation with the way computer device 1005 executes processes and performs operations.

Furthermore, computer-readable medium 1025 constitutes an apparatus from which computer device 1005 may access computer information, programs, code, and/or applications. Computer device 1005 may process the information, programs, code, and/or applications that cause computer device 1005 to perform additional operations.

Note that one may implement computer-readable medium 1025 in a variety of ways, as persons of ordinary skill in the art would understand. For example, memory within computer device 1005 may constitute a computer-readable medium 1025, as desired. Alternatively, computer-readable medium 1025 may include a set of associated, interrelated, coupled (e.g., through conductors, fibers, etc.), or networked computer-readable media, for example, when computer device 1005 receives the functional descriptive material from a network of computer devices or information-processing systems. Note that computer device 1005 may receive the functional descriptive material from computer-readable medium 1025, the network, or both, as desired.

As noted above, although the above description concerns in part the application of the disclosed concepts to PLDs, one may apply the disclosed concepts to a variety of other electronic circuits and devices, by making modifications that fall within the knowledge of persons of ordinary skill in the art who have the benefit of the description of the disclosed concepts. Some examples of such devices include custom, standard-cell, gate-array, structured application specific integrated circuit (ASIC) implementations.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An integrated circuit (IC), comprising:

a metastability-hardened synchronization circuit, comprising:

a plurality of sampling circuits that sample an input signal to generate a plurality of sampled signals; and a multiplexer that generates an output signal from the plurality of sampled signals by using a clock signal as a select signal, the clock signal having a frequency selected to reduce metastability of the synchronization circuit.

2. The integrated circuit (IC) according to claim 1, wherein each sampling circuit in the plurality of sampling circuits comprises a plurality of storage circuits coupled in a cascade arrangement.

3. The integrated circuit (IC) according to claim 2, wherein the plurality of storage circuits in each sampling circuit comprises flip-flops.

4. The integrated circuit (IC) according to claim 1, wherein each sampling circuit in the plurality of sampling circuits is clocked by a respective phase of the clock signal.

5. The integrated circuit (IC) according to claim 4, wherein the metastability-hardened synchronization circuit comprises first and second sampling circuits.

6. The integrated circuit (IC) according to claim 5, wherein each of the first and second sampling circuits comprises a pair of flip-flops coupled in a cascade arrangement.

7. The integrated circuit (IC) according to claim 5, wherein the first sampling circuit is clocked by the clock signal, and the second sampling circuit is clocked by a complement of the clock signal.

8. The integrated circuit (IC) according to claim 1, wherein the input signal comprises an asynchronous signal.

9. The integrated circuit (IC) according to claim 8, wherein the output signal comprises a synchronous signal.

10. The integrated circuit (IC) according to claim 1, further comprising programmable logic circuitry, wherein the metastability-hardened synchronization circuit is included in the programmable logic circuitry.

11. The integrated circuit (IC) according to claim 1, further comprising programmable interconnect circuitry, wherein the metastability-hardened synchronization circuit is included in the programmable interconnect circuitry.

12. A method of processing signals by using a metastability-hardened synchronization circuit, the method comprising:

sampling an input signal with a plurality of sampling circuits to generate a plurality of sampled signals; and multiplexing the plurality of sampled signals to generate an output signal from the plurality of sampled signals by using a clock signal as a select signal, the clock signal having a frequency selected to reduce metastability of the synchronization circuit.

13. The method according to claim 12, wherein sampling the input signal with a plurality of sampling circuits comprises sampling the input signal with a plurality of storage circuits coupled in a cascade arrangement.

14. The method according to claim 13, wherein the plurality of storage circuits in each sampling circuit comprises flip-flops.

15. The method according to claim 12, further comprising clocking each sampling circuit in the plurality of sampling circuits by a respective phase of the clock signal.

16. The method according to claim 15, wherein the metastability-hardened synchronization circuit comprises first and second sampling circuits.

17. The method according to claim 16, wherein each of the first and second sampling circuits comprises a pair of flip-flops coupled in a cascade arrangement.

18. The method according to claim 16, further comprising:

clocking the first sampling circuit by the clock signal; and clocking the second sampling circuit by a complement of the clock signal.

19. The method according to claim 12, wherein the input signal comprises an asynchronous signal.

20. The method according to claim 19, wherein the output signal comprises a synchronous signal.

21. The method according to claim 12, wherein the metastability-hardened synchronization circuit is included in programmable logic circuitry.

22. The method according to claim 12, wherein the metastability-hardened synchronization circuit is included in programmable interconnect circuitry.

* * * * *